United States Patent
Nakanishi et al.

(10) Patent No.: US 8,112,575 B2
(45) Date of Patent: Feb. 7, 2012

(54) MEMORY CONTROLLER, NONVOLATILE MEMORY DEVICE, ACCESS DEVICE, AND NONVOLATILE MEMORY SYSTEM

(75) Inventors: Masahiro Nakanishi, Kyoto (JP); Takuji Maeda, Osaka (JP); Toshiyuki Honda, Kyoto (JP); Tatsuya Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 425 days.

(21) Appl. No.: 12/376,153

(22) PCT Filed: Aug. 1, 2007

(86) PCT No.: PCT/JP2007/065074
§ 371 (c)(1),
(2), (4) Date: Mar. 24, 2009

(87) PCT Pub. No.: WO2008/016081
PCT Pub. Date: Feb. 7, 2008

(65) Prior Publication Data
US 2010/0005227 A1    Jan. 7, 2010

(30) Foreign Application Priority Data
Aug. 4, 2006   (JP) ................. 2006-213718

(51) Int. Cl.
G06F 12/00    (2006.01)
(52) U.S. Cl. ....... 711/103; 713/1; 710/56; 711/E12.093; 711/154; 711/170
(58) Field of Classification Search .............. 711/105, 711/115, 112, 114, 163, E12.093, 170, 154; 713/1; 710/56
See application file for complete search history.

(56) References Cited

U.S. PATENT DOCUMENTS

| | | | |
|---|---|---|---|
| 5,450,255 A | 9/1995 | Arisaka | |
| 6,611,907 B1 | 8/2003 | Maeda et al. | |
| 7,426,165 B2 * | 9/2008 | Sasaki | 369/53.34 |
| 7,454,568 B2 * | 11/2008 | Moro | 711/115 |
| 2001/0014933 A1 | 8/2001 | Shibazaki et al. | |
| 2003/0046490 A1 * | 3/2003 | Busser et al. | 711/114 |
| 2004/0057366 A1 * | 3/2004 | Sasaki | 369/53.37 |

(Continued)

FOREIGN PATENT DOCUMENTS
JP    62-049427 A    3/1987

(Continued)

OTHER PUBLICATIONS
English language Abstract of JP 62-049427 A.

(Continued)

Primary Examiner — Pierre-Michel Bataille
(74) Attorney, Agent, or Firm — Greenblum & Bernstein, P.L.C.

(57) ABSTRACT

A file to be read or written is designated and accessed from an access device side to a nonvolatile memory device. In an initialization after start-up of the power source, an empty capacity detector detects empty capacity parameters of a nonvolatile memory with dividing the memory into a plurality of regions. An empty capacity parameter notification part notifies the access device of the empty capacity parameters in a stepwise fashion whenever the empty capacity detector detects an empty capacity. With this, at the time when the empty capacity becomes not less than a capacity required to write file data, the data can be written to the nonvolatile memory without waiting for completion of the initialization, resulting in improvement of a response in the recording.

20 Claims, 19 Drawing Sheets

U.S. PATENT DOCUMENTS

| | | |
|---|---|---|
| 2006/0195708 A1 | 8/2006 | Kato et al. |
| 2007/0067699 A1* | 3/2007 | Koga et al. .................... 714/763 |
| 2007/0277076 A1 | 11/2007 | Tamura et al. |
| 2008/0028129 A1 | 1/2008 | Nakanishi et al. |
| 2008/0049504 A1 | 2/2008 | Kasahara et al. |

FOREIGN PATENT DOCUMENTS

| | | |
|---|---|---|
| JP | 5-108462 A | 4/1993 |
| JP | 5-276471 A | 10/1993 |
| JP | 2000-090004 A | 3/2000 |
| JP | 2001-188701 A | 7/2001 |

OTHER PUBLICATIONS

English language Abstract of JP 2000-090004 A.
English language Abstract of JP 5-108462 A.
English language Abstract of JP 5-276471 A.
English language Abstract of JP 2001-188701 A.

* cited by examiner

FIG. 3

| Cluster | Logical block |
|---|---|
| | L1 |
| | L2 |
| C1 (e) | L3 (e) |
| C2 | L4 |
| C3 (e) | L5 (e) |
| C4 | L6 |
| C5 (e) | L7 (e) |
| C6 | L8 |
| C7 (e) | L9 (e) |
| C8 | L10 |
| C9 | L11 |
| C10 | L12 |
| C11 (e) | L13 (e) |
| C12 | L14 |
| C13 (e) | L15 (e) |
| C14 | L16 |
| C15 (e) | L17 (e) |
| C16 (e) | L18 (e) |
| ⋮ | ⋮ |
| C59994 (e) | L59996 (e) |
| C59995 (e) | L59997 (e) |
| C59996 (e) | L59998 (e) |
| C59997 | L59999 |
| C59998 | L60000 |

FIG. 4

| Logical block | Physical block | Block status |
|---|---|---|
| L1 | B15 | 1 |
| L2 | B8 | 1 |
| L3 | B60000 | 0 |
| L4 | B6 | 1 |
| L5 | B13211 | 0 |
| L6 | B9001 | 1 |
| L7 | B4344 | 0 |
| L8 | B17 | 1 |
| L9 | B1256 | 0 |
| L10 | B9813 | 1 |
| L11 | B32432 | 1 |
| L12 | B146 | 1 |
| L13 | B36 | 0 |
| L14 | B26610 | 1 |
| L15 | B5676 | 0 |
| L16 | B1464 | 1 |
| L17 | B19997 | 0 |
| L18 | B37618 | 0 |
| ⋮ | ⋮ | ⋮ |
| L59996 | B19802 | 0 |
| L59997 | B25033 | 0 |
| L59998 | B1334 | 0 |
| L59999 | B65535 | 1 |
| L60000 | B45536 | 1 |

FIG. 6

| Cluster | Logical block |
|---|---|
| (shaded) | L1 (shaded) |
| (shaded) | L2 (shaded) |
| C1 | L3 (e) |
| C2 | L4 (shaded) |
| C3 (shaded) | L5 (e) |
| C4 (shaded) | L6 (shaded) |
| C5 (shaded) | L7 (e) |
| C6 (shaded) | L8 (shaded) |
| C7 (shaded) | L9 (e) |
| C8 (shaded) | L10 (shaded) |
| C9 | L11 |
| C10 | L12 (shaded) |
| C11 (shaded) | L13 (e) |
| C12 | L14 |
| C13 | L15 (e) |
| C14 (shaded) | L16 (shaded) |
| C15 | L17 (e) |
| C16 (e) | L18 (e) |
| ⋮ | ⋮ |
| C59994 | L59996 (e) |
| C59995 (e) | L59997 (e) |
| C59996 (e) | L59998 (e) |
| C59997 | L59999 |
| C59998 | L60000 |

FIG. 7

| Logical block | Physical block | Block status |
|---|---|---|
| L1 | B15 | 1 |
| L2 | B8 | 1 |
| L3 | B60000 | 0 |
| L4 | B6 | 1 |
| L5 | B13211 | 0 |
| L6 | B9001 | 1 |
| L7 | B4344 | 0 |
| L8 | B17 | 1 |
| L9 | B1256 | 0 |
| L10 | B9813 | 1 |
| L11 | B32432 | 1 |
| L12 | B146 | 1 |
| L13 | B36 | 0 |
| L14 | B26610 | 1 |
| L15 | B5676 | 0 |
| L16 | B1464 | 1 |
| L17 | B19997 | 0 |
| L18 | B37618 | 0 |
| ⋮ | ⋮ | ⋮ |
| L59996 | B19802 | 0 |
| L59997 | B25033 | 0 |
| L59998 | B1334 | 0 |
| L59999 | B65535 | 1 |
| L60000 | B45536 | 1 |

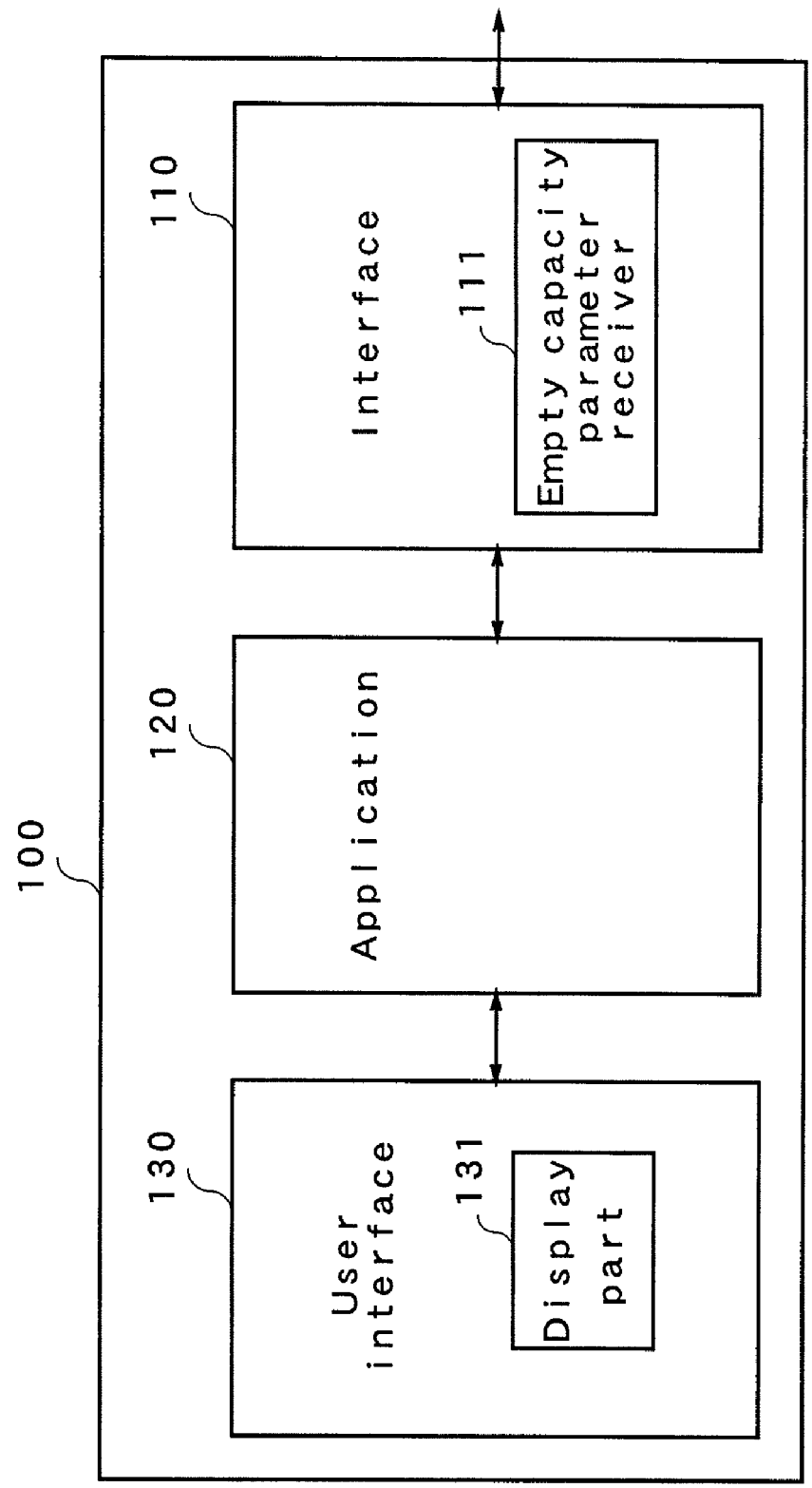

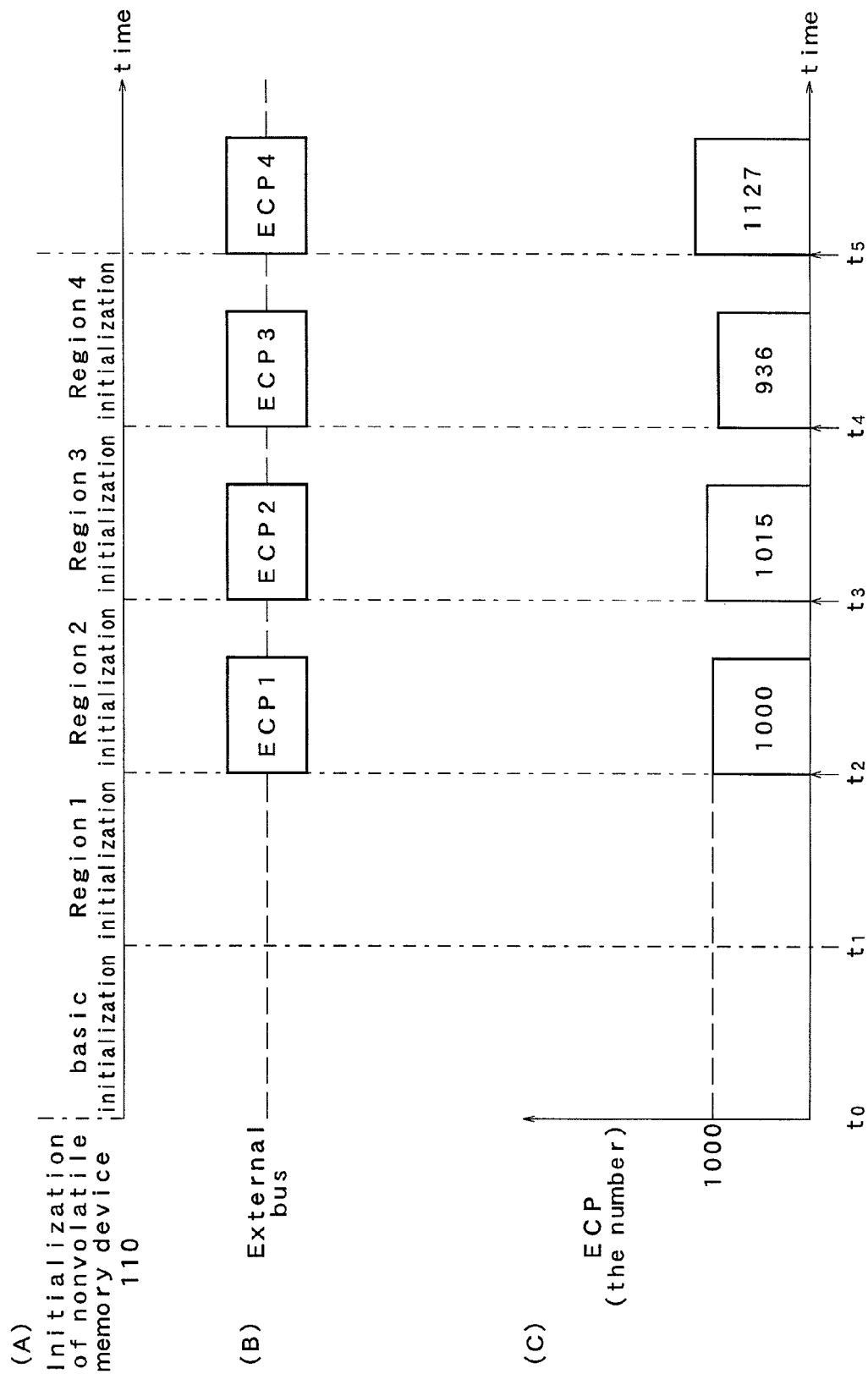

F I G. 1 2

| FN | b15 | | | | | | | | | | | | | | | b0 |
|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 1 | 0 | 0 | 1 |
| 2 | | | | | | | | | | | | | | | | |
| 3 | | | | | | | | | | | | | | | | |
| 4 | | | | | | | | | | | | | | | | |
| ⋮ | | | | | | | | | | | | | | | | |
| 65536 | | | | | | | | | | | | | | | | |

Transmission of access device 100: | Write command | File number | File size | File data 1 | ... | File data j |

(B)

Transmission of access device 100: | Read command | File number | Offset | Read size |

Reception of access device 100: | File data 1 | ... | File data k |

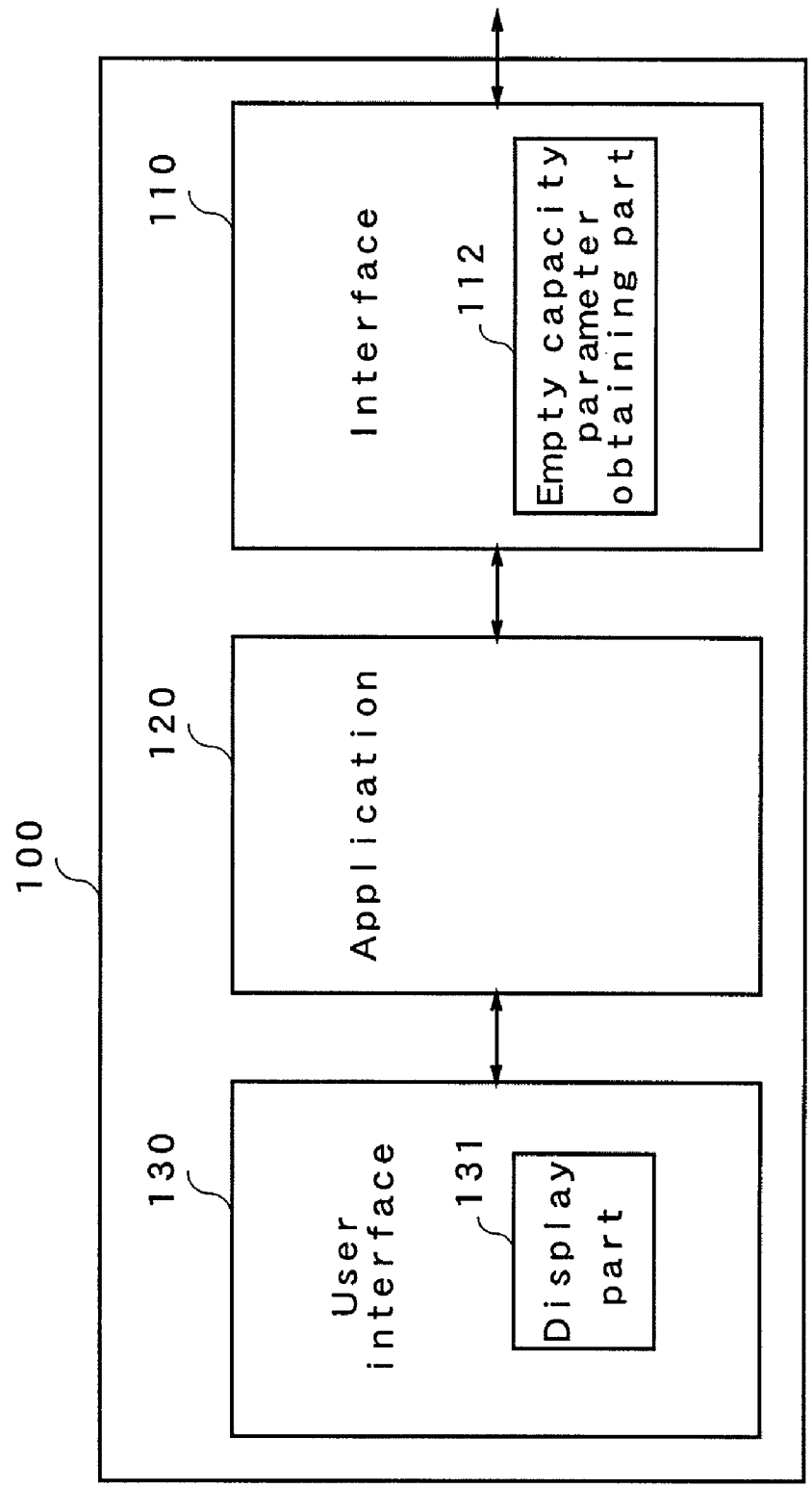

MEMORY CONTROLLER, NONVOLATILE MEMORY DEVICE, ACCESS DEVICE, AND NONVOLATILE MEMORY SYSTEM

TECHNICAL FIELD

The present invention relates to a nonvolatile memory device such as a semiconductor memory card having a nonvolatile memory, a memory controller for controlling this device, an access device for accessing said nonvolatile memory device, and a nonvolatile memory system configured by adding the access device as a component to said nonvolatile memory device.

BACKGROUND ART

A nonvolatile memory device having a rewritable nonvolatile memory is increasingly demanded mainly for a semiconductor memory card. The semiconductor memory card is high-price compared to an optical disk, media of tape, and the like, however, the demand is widely increasing as a memory medium for a portable apparatus such as a digital still camera and a mobile phone because of merits such as small-size, lightweight, vibration resistance, and easy handling. This semiconductor memory card has a flash memory as a nonvolatile main memory and includes a memory controller for controlling the memory. The memory controller controls the flash memory on the reading and writing of data in accordance with reading and writing commands from the access device such as a digital still camera and a personal computer.

Such semiconductor memory card is attached to an access device, for example, a digital still camera. The access device handles the semiconductor memory card as a removable disk and controls it by using a file system, for example, a FAT file system. The FAT file system manages file data in units of clusters by using a file allocation table (hereinafter referred to as a FAT), allocates the file data to an empty cluster, and further designates, to the nonvolatile memory device, the file data and a cluster number (a logical address) to which the file data is allocated. For example, patent document 1 discloses a nonvolatile memory system using such FAT file system in detail.

Since requiring relatively long time for the writing and erasing to a memory cell array of recording unit, a flash memory incorporated in a product such as the semiconductor memory card and a portable audio is configured so as to collectively erase and write data of a plurality of the memory cells. Specifically, the flash memory is composed of a plurality of physical blocks and the physical block includes a plurality of pages, and the data is erased in units of the physical blocks and is written in units of the pages.

The flash memory has problems with reliability that a physical block to which data is written changes into a bad block during the writing of data and that the number of times of the rewriting is limited. To manage these problems, the memory controller executes a substitute process for a physical block which generated a defect and executes a wear leveling process for avoiding concentration of the rewriting to a certain physical block. The memory controller internally includes a physical region management table and a logical-physical conversion table, and manages physical addresses of the flash memory by using them. In initialization processing at application of the power source, the memory controller creates the physical region management table and the logical-physical conversion table in an internally provided RAM by checking a recording status of the flash memory in order to simplify such management of the addresses. The memory controller notifies the access device of completion of the initialization processing after the tables have been created, and permits the access device to send commands for reading and writing file data. For the subsequent read and the write commands sent from the access device, the memory controller can easily specify, to the flash memory, a physical address of a target to which data is written or from which data is read.

Patent document 2 discloses a technique for rationalizing this initialization processing. According to Patent document 2, when the table corresponding to a part of region of the flash memory has been created during the initialization processing, it is notified to the access device that the initialization has been partially completed. This enables the access device to immediately access the memory card to execute any processing or prevents the access device from faultily recognizing that an error has occurred in the memory card.

Patent document 1: Japanese Unexamined Patent Publication No. 2001-188701
Patent document 2: Japanese Unexamined Patent Publication No. 2000-90004

DISCLOSURE OF THE INVENTION

Problems to be Solved by the Invention

However, it is assumed that, in such nonvolatile memory system, the access device issues a logical address with a requirement of the writing to the nonvolatile memory device immediately after the memory device has notified the access device of the partial completion of the initialization processing. On this occasion, when the initialization for accepting the issued logical address, creation of the logical-physical conversion table corresponding to the logical address and the like, has not been completed, the requirement of the writing from the access device is kept waiting because the nonvolatile memory device firstly creates the logical-physical conversion table corresponding to the incomplete portion. Especially in a case where logical addresses notified by the access device at the time of newly writing file data, the logical addresses corresponding to empty clusters to which the file data is allocated, are widely dispersed over the entire region of the flash memory, the entire region of the nonvolatile memory must be initialized. For this reason, the conventional nonvolatile memory system cannot solve a problem that a photo opportunity is missed during a period immediately after the application of the power source until the completion of the entire initialization processing in a case of using the nonvolatile memory device for the digital still camera. A response of the nonvolatile memory device side able to quickly start the writing in response to the requirement of the writing from the access device is referred to as a recording response.

Referring to FIG. 1 to FIG. 7, a problem of an access method (hereinafter referred to as an access method in logical address level) employed by the conventional nonvolatile memory system will be explained especially in that it is hard to improve the recording response.
[A Case of a Matched Boundary File System]

Referring to FIG. 1 and FIG. 2, a nonvolatile memory system employing a matched boundary file system will be firstly explained. FIG. 1 is a configuration diagram showing a nonvolatile memory system employing the FAT file system shown in Patent document 1, and FIG. 2 is a memory map showing a correspondence relation between a logical address space and a physical address space in the nonvolatile memory system employing the matched boundary file system. To simplify the description, both of a cluster size and a physical block size are 16 kbytes.

In FIG. 2, C1 to Cn-2 show cluster numbers CN, L1 to Ln show logical block numbers LBN, and these compose the logical address space LA. The logical block numbers are continuously added in units of the physical block sizes (16 kbytes in the case of FIG. 2) from a first address in the logical address space, and the file data is recorded to the logical addresses L3 to Ln among them. PA shows the physical address space of a nonvolatile memory 15, and the physical address space includes a normal region and a spare region. Physical block numbers B1 to Bn+m are continuously added from a first address in the physical address space in units of the physical block sizes (16 kbytes in the case of FIG. 2).

In FIG. 2, the normal region of the physical address space PA has a size equivalent to that of the entire logical address space, and the spare region of the physical address space is used as a substitute block in a case where a physical block in the normal region turns into a defective block. In addition, the normal region and the spare region are not physically fixed, and their physical locations are arbitrarily changed by the logical-physical conversion using the logical-physical conversion table of the memory controller 14. They are separately shown on the figure for the purpose of easy understanding. The physical address space also includes a system region for storing information related to security in addition to the normal region and spare region.

As shown by a dashed-dotted line in FIG. 2, the matched boundary file system matches a start address of a data region starting from logical block number L3 in the logical address space with a boundary of the physical blocks (for example, a boundary between B2 and B3) constituting the physical address space. Number 16 in FIG. 2 shows the boundary. Since a size of the physical block is generally an integral multiple (for example, same size) of a size of cluster, a management unit of the logical address space, a boundary between arbitrary physical blocks is matched with a boundary between the clusters. The matched boundary file system applies to, for example, a digital still camera using the SD card.

When the application 11 provided in the access device 10 issues a command for writing a desired file data, the file system 12 allocates the file data to empty clusters (for example, C1 and C2) on the data region on the logical address space shown in FIG. 2. When writing the data to a nonvolatile memory device 13, the file system 12 transfers the file data and a logical block number corresponding to clusters to which the file data is allocated to the nonvolatile memory device 13. A memory controller 14 in the nonvolatile memory device 13 converts the logical block number into a physical block number in logical-physical conversion processing, and writes the file data, for example, to Bn and B6. As described above, in the access method in logical address level, the access device 10 side manages the file data allocation for each management unit (cluster) on the logical address space, and the nonvolatile memory device 13 side manages mapping of the file data allocated to said cluster for each management unit (physical block) on the physical address space. Both names, the "allocate" and "mapping", express the same meaning of "the allocation of file data to a management unit", however, the different names of "allocate" and "mapping" are consciously used in the logical address space and physical address space, respectively.

In the access method in logical address level, the nonvolatile memory device 13 is formatted when, for example, used first after a shipment. Specifically, the access device 10 obtains an entire size of the logical address space (n×16 kbytes in FIG. 2) from the nonvolatile memory device 13 via an external bus, and formats the memory device to set the entire size of the logical address space to be n×16 kbytes. This processing prepares the management region and the data region in the logical address space, further generates management information, for example, a file allocation table (FAT) for managing these regions, and writes the management information to the nonvolatile memory device 13.

In starting up the electric power source, the nonvolatile memory device 13 informs the access device 10 of own busy state, and subsequently checks states of the respective physical blocks of the entire physical address space of the nonvolatile memory 15 to creates a physical region management table and a logical-physical conversion table. Upon completion of this processing, the memory device releases the busy state to the access device 10, and shifts to a state to wait an access from the access device 10.

Meanwhile, when recognizing that the nonvolatile memory device 13 has released the busy state and completes the initialization processing, the access device 10 prepares the writing of file data by reading the FAT from the nonvolatile memory device 13 and searching an empty cluster based on the FAT.

In the initialization processing of the nonvolatile memory device 13, the processing for creating the physical region management table and the logical-physical conversion table shares most time of the initialization processing. The nonvolatile memory system shown in Patent document 2 informs the access device of a state of midstream of the initialization processing to rationalize this initialization time.

As such partial initialization processing, considered will be an initialization of the normal region of the physical address space including 60000 blocks with separating the blocks into 4 physical regions, physical block numbers 1 to 15000, physical block numbers 15001 to 30000, physical block numbers 30001 to 45000, and physical block numbers 45001 to 60000.

It will be explained how does an empty physical block number found in the initialization processing of the physical block numbers 1 to 15000 correspond to a cluster. FIG. 3 shows a relationship between a cluster and a logical block. FIG. 4 shows logical blocks, physical blocks, and block statuses of the logical blocks. In addition, FIG. 4 includes information stored in the physical region management table and the logical-physical conversion table. The block statuses in the right column of FIG. 4 are information normally stored in the physical region management table, the information is shown to simplifying the description by only 1-bit flag for identifying an empty physical block. A physical block of a value 0 in the block status is an empty physical block, and a physical block of a value 1 stores valid file data. Physical blocks, logical blocks, clusters corresponding to the physical block numbers 1 to 15000 are shown by the hatchings. In addition, a symbol (e) shows an empty block.

FIG. 3 and FIG. 4 show which cluster corresponds to an empty physical block. Among the clusters corresponding to the physical block numbers 1 to 15000, namely, the clusters shown by the hatchings, the clusters C3, C5, C7, C11, C13, ..., C59996 correspond to empty logical blocks (logical blocks corresponding to a physical block of the value 0 in the block status), and thus these clusters are empty. The empty clusters in the entire logical address can be identified based on the FAT upon completion of the initialization of the physical block numbers 1 to 15000. However, the physical region management table and logical-physical conversion table including empty clusters (for example, C15) not shown by the hatching in FIG. 3 have not been created yet. Thus, when allocated to the empty cluster to be written to the nonvolatile memory device 13, a file will be made to wait on the nonvolatile memory device 13 side. Empty clusters to which the file data can be instantaneously written are limited to the empty clusters corresponding to a region of the initialized physical block numbers 1 to 15000, namely, to the empty clusters shown by the hatching.

As described above, the matched boundary file system formats the memory device so that a boundary between the physical blocks can match a start position of the data region. The file system is accordingly able to specify an empty cluster number to which file data can be instantaneously written by specifying empty logical block number and informing the access device 10 of the empty logical block number on the basis of the empty physical block number (the block of value 0 in the block status) found in the initialization processing and of the logical-physical conversion table in FIG. 4.

However, since it is required as described above to transfer information for relating empty cluster numbers to the empty physical block numbers shown in FIG. 4 from the nonvolatile memory device 13 to the access device 10 via an external bus to that end, this procedure requires long transfer time. In addition, the processing will be complicated for both of the access device 10 and the nonvolatile memory device 13.

[A Case of an Unmatched Boundary File System]

FIG. 5 shows a memory map showing a relationship between the logical address space and the physical address space in the nonvolatile memory system employing an unmatched-boundary file system. As shown by a dashed-dotted line in FIG. 5, the unmatched boundary file system does not match a start address of a data region in the logical address space with a boundary of the physical blocks constituting the physical address space. A FAT file system applied to, for example, a personal computer corresponds to this system. In addition to the problems shown in the above mentioned explanation of the matched boundary file system, if obtaining an empty physical block number, the unmatched boundary file system has a problem that cannot correctly identify an empty cluster number based on the obtained block number.

Here, it will be explained how does the empty physical block number found in the initialization processing to the physical block numbers 1 to 15000 correspond to the cluster. FIG. 6 shows a relationship between the clusters and the logical blocks, and FIG. 7 shows the logical blocks, the physical blocks, and the block statuses of the physical blocks. The physical blocks, logical blocks, and clusters corresponding to the physical block numbers 1 to 15000 are shown by the hatching. In addition, FIG. 7 shows the same state as that of FIG. 4.

FIG. 6 and FIG. 7 illustrate which clusters correspond to the empty physical blocks. In the clusters corresponding to the physical block numbers 1 to 15000, namely, the clusters shown by the hatching, there is no cluster where a corresponding logical block including the cluster shown by the hatching is empty in an example of FIG. 6. For example, in C4, the logical block numbers including C4 are L5 (empty) and L6, it cannot be determined whether or not a latter portion of C4 corresponding to the logical block number L6 is empty and whether or not valid file data is allocated. In a case where the valid file data is allocated to the latter portion of C4, since the already allocated valid data is lost if new file data is allocated to C4, C4 has to be so managed as not to be empty.

Accordingly, the unmatched boundary file system formats the memory device but a boundary between the physical blocks is not matched with a start position of the data region. Accordingly, the system cannot correctly specify an empty cluster number to which file data can be instantaneously written even when an empty logical block number is identified based on the empty physical block number found in the initialization processing and on the logical-physical conversion table in FIG. 7 and the specified empty logical block number is informed to the access device 10. Consequently, even if there are sufficient empty physical blocks for writing file data, the system cannot write the file data, resulting in difficulty improving a response in the writing.

As described above, since the access method in logical address level has the problem caused in relating a state of the physical address space to a state of the logical address space, it is difficult to improve the response in the writing.

In consideration of the above mentioned problems, the present invention accordingly intends to provide a memory controller, nonvolatile memory device, access device, and nonvolatile memory system which enables the access device to write data without waiting the completion of the entire initialization, namely, has a good response in the writing.

Means to Solve the Problems

To solve the problems, a memory controller according to the present invention which is connected to a nonvolatile memory, writes file data to said nonvolatile memory in accordance with a file ID designated by an outside, and reads file data from said nonvolatile memory, comprises: an empty capacity detector for detecting an empty capacity of an initialized region during an initialization of said nonvolatile memory; and a notification part for notifying an outside of an empty capacity parameter related to the empty capacity parameter detected by said empty capacity detector in a stepwise fashion.

To solve the problems, a nonvolatile memory device according to the present invention which writes file data to said nonvolatile memory in accordance with a file ID designated by an outside, and reads file data from said nonvolatile memory, wherein said nonvolatile memory device comprises: a nonvolatile memory; and a memory controller, and said memory controller includes: an empty capacity detector for detecting an empty capacity of an initialized region during an initialization of said nonvolatile memory; and a notification part for notifying an outside of an empty capacity parameter related to the empty capacity parameter detected by said empty capacity detector in a stepwise fashion.

To solve the problems, a nonvolatile memory system according to the present invention comprises: an access device; and a nonvolatile memory device which writes file data in accordance with a file ID designated by said access device, and reads file data from a nonvolatile memory, wherein said nonvolatile memory device includes: a nonvolatile memory; and a memory controller, said memory controller includes: an empty capacity detector for detecting an empty capacity of an initialized region during an initialization of said nonvolatile memory; and a notification part for notifying an outside of an empty capacity parameter related to the empty capacity parameter detected by said empty capacity detector in a stepwise fashion, and said access device includes: an empty capacity parameter receiver for receiving an empty capacity parameter from said nonvolatile memory device; and an application for judging whether data writing to said nonvolatile memory device is possible or not on the basis of the empty capacity parameter received by said empty capacity parameter receiver and for reading and writing file data by designating the file ID to said nonvolatile memory device.

To solve the problems, a nonvolatile memory system according to the present invention comprises: an access device; and a nonvolatile memory device which writes file data in accordance with a file ID designated by said access device, and reads file data from a nonvolatile memory, wherein said nonvolatile memory device includes: a nonvolatile memory; and a memory controller, said memory controller includes: an empty capacity detector for detecting an empty capacity of an initialized region during an initialization of said nonvolatile memory; and a notification part for notifying an outside of an empty capacity parameter related to the empty capacity parameter detected by said empty capacity detector in a stepwise fashion, and said access device includes: an empty capacity parameter obtaining part for obtaining an empty capacity parameter from said nonvolatile memory device; and an application for judging whether data writing to said nonvolatile memory device is possible or not on the basis of the empty capacity parameter obtained by said empty capacity parameter obtaining part and for reading and writing file data by designating the file ID to said nonvolatile memory device.

Said empty capacity detector may detect, for each divided region of said nonvolatile memory, the empty capacity parameter of the region.

Said empty capacity detector may detect the empty capacity of all of already initialized regions during an initialization of said nonvolatile memory.

Said notification part may notify an outside of a file ID stored in the initialized region in addition to the empty capacity parameter.

To solve the problems, an access device according to the present invention which is connected to a nonvolatile memory device having a nonvolatile memory and uses the memory device, wherein said access device comprises: an empty capacity parameter receiver for receiving an empty capacity parameter from said nonvolatile memory device; and an application for judging whether data writing to said nonvolatile memory device is possible or not on the basis of the empty capacity parameter received by said empty capacity parameter receiver and for reading and writing file data by designating the file ID to said nonvolatile memory device.

To solve the problems, an access device according to the present invention which is connected to a nonvolatile memory device having a nonvolatile memory and uses the memory device, wherein said access device includes: an empty capacity parameter obtaining part for obtaining an empty capacity parameter from said nonvolatile memory device; and an application for judging whether data writing to said nonvolatile memory device is possible or not on the basis of the empty capacity parameter obtained by said empty capacity parameter obtaining part and for reading and writing file data by designating the file ID to said nonvolatile memory device.

Said access device may further comprise a display part for displaying information related to an empty capacity of said nonvolatile memory device on the basis of said empty capacity parameter.

Effectiveness of the Invention

The present invention is based on an access method where an access device side addresses a file to be read or written to a nonvolatile memory device, an empty capacity detector detects an empty capacity of a nonvolatile memory in an initialization processing after starting up the power source, and an empty capacity parameter notification part notifies the access device of an empty capacity parameter related to the empty capacity in the midstream of detection processing of said empty capacity detector. For this reason, when an empty capacity more than a required capacity to write the file data is detected, the access device can write a file data without waiting detection of the entire empty capacity corresponding to the entire region of the nonvolatile memory. As the result, a response in the writing can be improved.

BRIEF DESCRIPTION OF DRAWINGS

FIG. 3 is a memory map showing a relationship between clusters and logical blocks in the nonvolatile memory system employing the matched boundary file system.

FIG. 4 is a memory map showing a relationship of the logical blocks, physical blocks, and block statuses in the nonvolatile memory system employing the matched boundary file system.

FIG. 6 is a memory map showing a relationship between clusters and logical blocks in the nonvolatile memory system employing the unmatched boundary file system.

FIG. 7 is a memory map showing a relationship of the logical blocks, physical blocks, and block statuses in the nonvolatile memory system employing the unmatched boundary file system.

FIG. 8A is a block diagram showing an access device of a nonvolatile memory system in an embodiment of the present invention.

FIG. 10 is an explanation view showing a notification sequence of the empty capacity parameter in a partial notification mode.

FIG. 12 is a memory map showing a mapping table.

FIG. 14 is a time chart showing an outline of a communication procedure between the access device and the nonvolatile memory device.

FIG. 17 is a block diagram showing an access device of a nonvolatile memory system according to a modified example of the embodiment of the present invention.

EXPLANATION FOR REFERENCE NUMERALS

Figure 1:
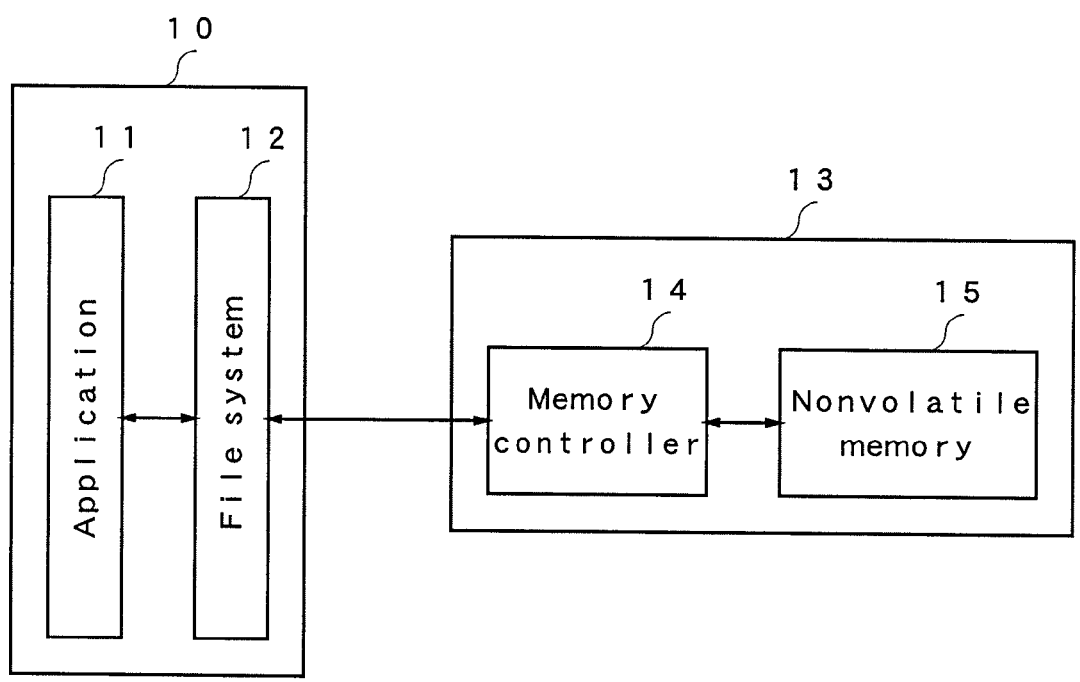
FIG. 1 is a block diagram showing a nonvolatile memory system in an access method in logical address level.
Figure 2:
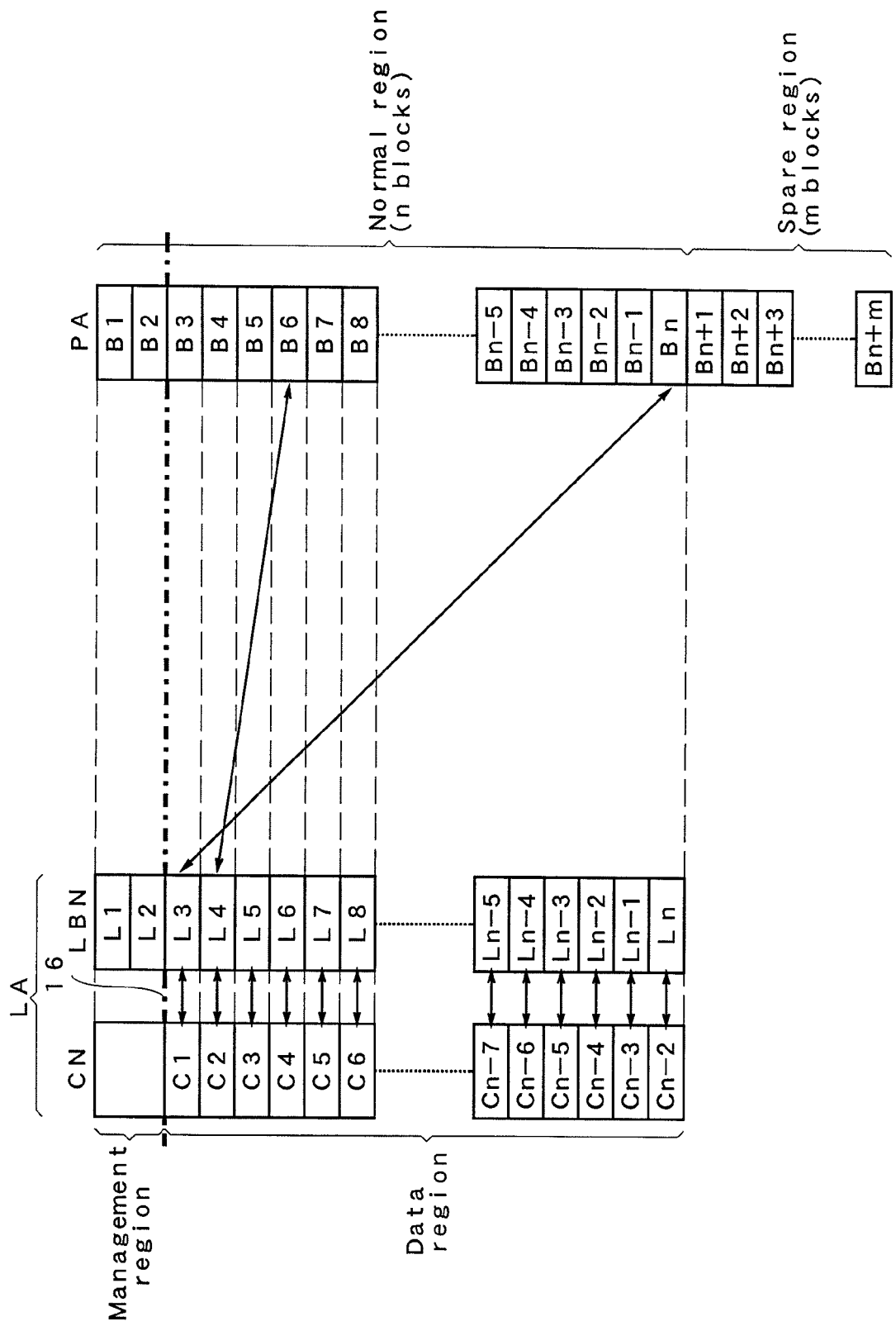
FIG. 2 is a memory map showing a relationship between a logical address space and a physical address space in a nonvolatile memory system employing a matched boundary file system.
Figure 5:
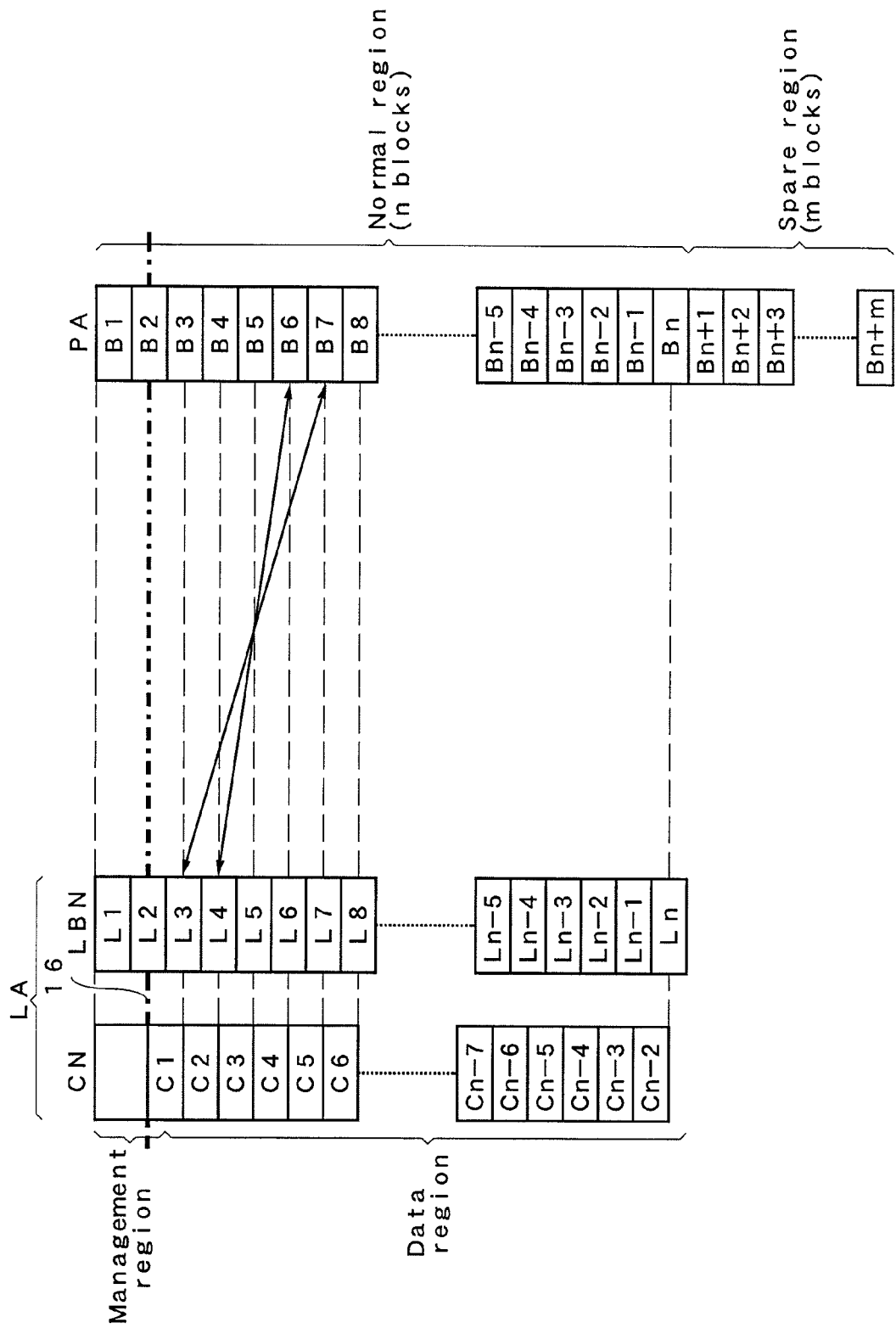
FIG. 5 is a memory map showing a relationship between a logical address space and a physical address space in a nonvolatile memory system employing an unmatched boundary file system.

100 Access device
110 Interface
111 Empty capacity parameter receiver

112 Empty capacity parameter obtaining part
120 Application
130 User interface
200 Nonvolatile memory device
210 Nonvolatile memory
220 Memory controller
230 Interface
240 Read and write controller
241 Physical region management table
242 Mapping table
250 Empty capacity parameter notification part
251 Notification part
252 Empty capacity parameter retainer
260 Empty capacity detector

BEST MODE FOR CARRYING OUT THE
INVENTION

In the present embodiment, different address spaces of an access device and a nonvolatile memory device are not related with each other in order to avoid the above mentioned problems caused by the access method in logical address level. And, the inventors found that the problems caused when a state of the physical address space is related to a state of the logical address space can be solved by a method: the access device addresses a file ID; and the nonvolatile memory device maps file data related to the file ID on the physical address space of a nonvolatile memory. This method is hereinafter referred to as a file level access method.

Embodiment

Figure 8B:
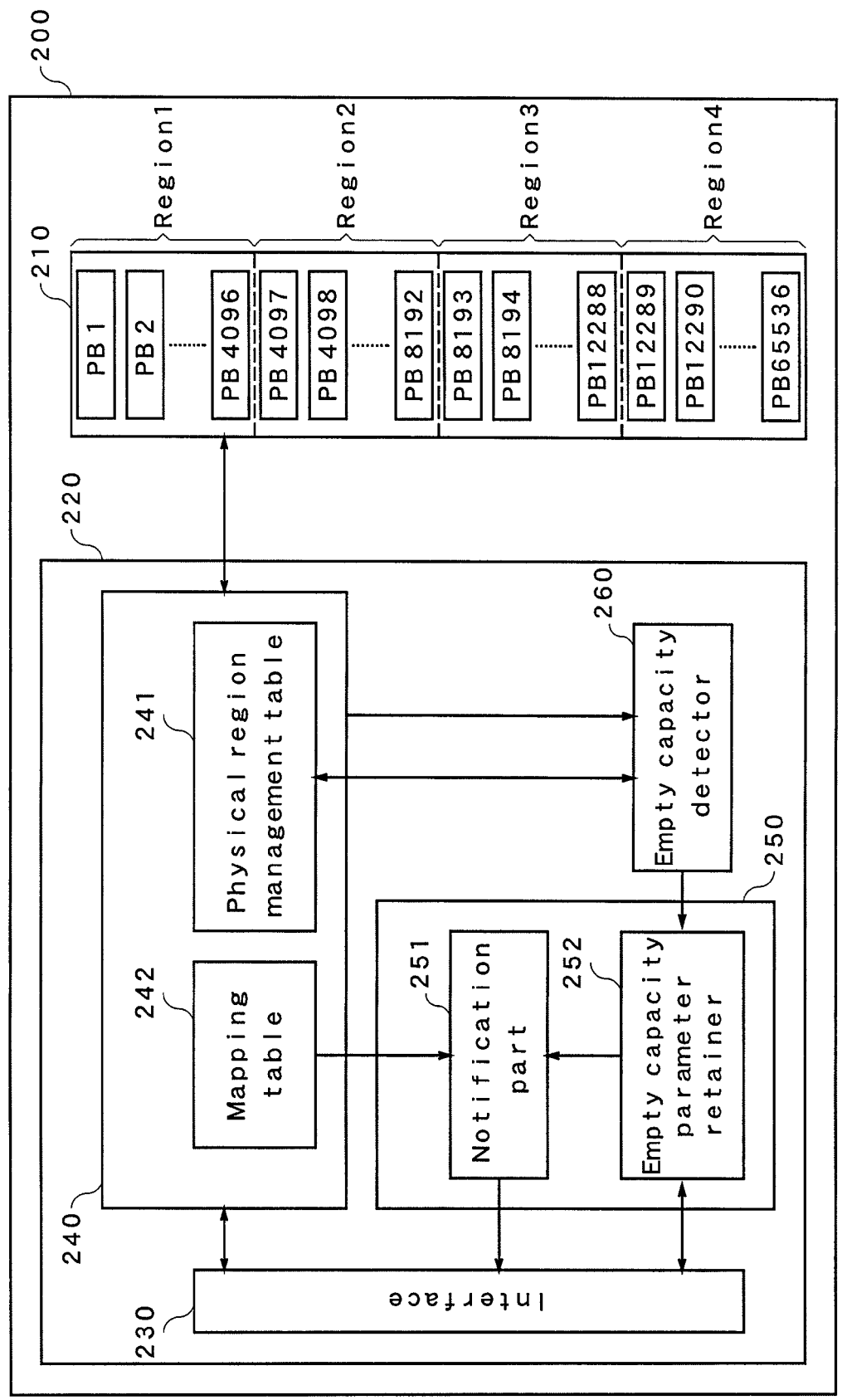
FIG. 8B is a block diagram showing a nonvolatile memory device of the nonvolatile memory system in the embodiment.

FIG. 8A is a block diagram showing an access device 100 of a nonvolatile memory system in an embodiment of the present invention, and FIG. 8B shows a nonvolatile memory device 200. The nonvolatile memory system is configured by including the access device 100 and the nonvolatile memory device 200. The access device 100 includes an interface (IF) 110, an application 120, and a user interface 130.

The interface 110 is a block for transferring the file data and a file ID of the file data from the application 120 to the nonvolatile memory device 200 when writing file data and for transferring file data read from the nonvolatile memory device 200 to the application 120. The interface 110 is provided with an empty capacity parameter receiver 111.

The application 120 calculates an empty capacity on the basis of a received empty capacity parameter, and displays the empty capacity on a display part 131 of the user interface. The application 120 further controls the writing and reading of file data in response to user's recording and reproducing operations. The file ID is information used for identifying files, and is represented by a file number in the embodiment.

A nonvolatile memory 210 is a flash memory whose one physical block has a size of 16 kbytes. To simplify the description, the memory includes no bad block. When having a capacity of 1 Gbytes for example, the number of physical blocks in a region used by the access device 100 is 65,536 since the physical block of the nonvolatile memory 210 has the size of 16 kbytes. Here, PB shows a physical block number, the nonvolatile memory 210 includes 4 regions, 1 to 4, of PB1 to PB4096, PB4096 to PB 8192, PB8193 to PB12288, and PB12289 to PB65536.

The respective physical blocks are composed of 32 pages, and the respective pages are composed of a data portion of 512 bytes and a management portion of 16 bytes. At the time when data is written to the first page, a block status, file number, and pointer described later of the physical block are written to the management portion of a first page.

A memory controller 220 includes an interface 230, a read and write controller 240, an empty capacity parameter notification part 250, and an empty capacity detector 260.

The interface 230 receives file data and a file ID used for writing and reading a file from the access device 100, and sends file data to the access device 100 in reading a file.

The read and write controller 240 includes a physical region management table 241 and mapping table 242 realized by a volatile RAM. The physical region management table 241 is a memory map showing use statuses of the physical blocks. The mapping table 242 is a table showing physical addresses related to file numbers. The read and write controller 240 controls the reading and writing of file data sent and received by the interface 230, and reads and writes the file data from and to the nonvolatile memory 230 on the basis of the file ID.

The empty capacity parameter notification part 250 includes a notification part 251 and an empty capacity parameter retainer 252. The empty capacity parameter retainer 252 retains an empty capacity parameter of an empty capacity of the nonvolatile memory 210; the empty capacity is detected by the empty capacity detector 260 on the basis of the physical region management table 241. In addition, the notification part 251 appropriately notifies the access device 100 of the empty capacity parameter retained by the retainer 252 via the interface 230, and further notifies the access device of a file ID, the file number here, recorded in a region where the initialization completes.

The empty capacity detector 260 detects an empty capacity sequentially from a first physical block in the region 1 of the nonvolatile memory 210 on the basis of the physical region management table, and sends the detected empty capacity to the empty capacity parameter notification part 250. The empty capacity detector 260 has two detection modes; one is for detecting an empty capacity of each initialized region and the other is for detecting a cumulative empty capacity of the initialized entire regions.

Processing of the present embodiment will be explained below separately divided into the initialization processing at start-up of the power source and the processing in a normal operation. Since the initialization processing includes a feature of the present invention, the initialization processing will be mainly explained. At first, a partial notification mode will be explained.

[Initialization Processing at Start-Up of the Power Source]

Figure 9A:
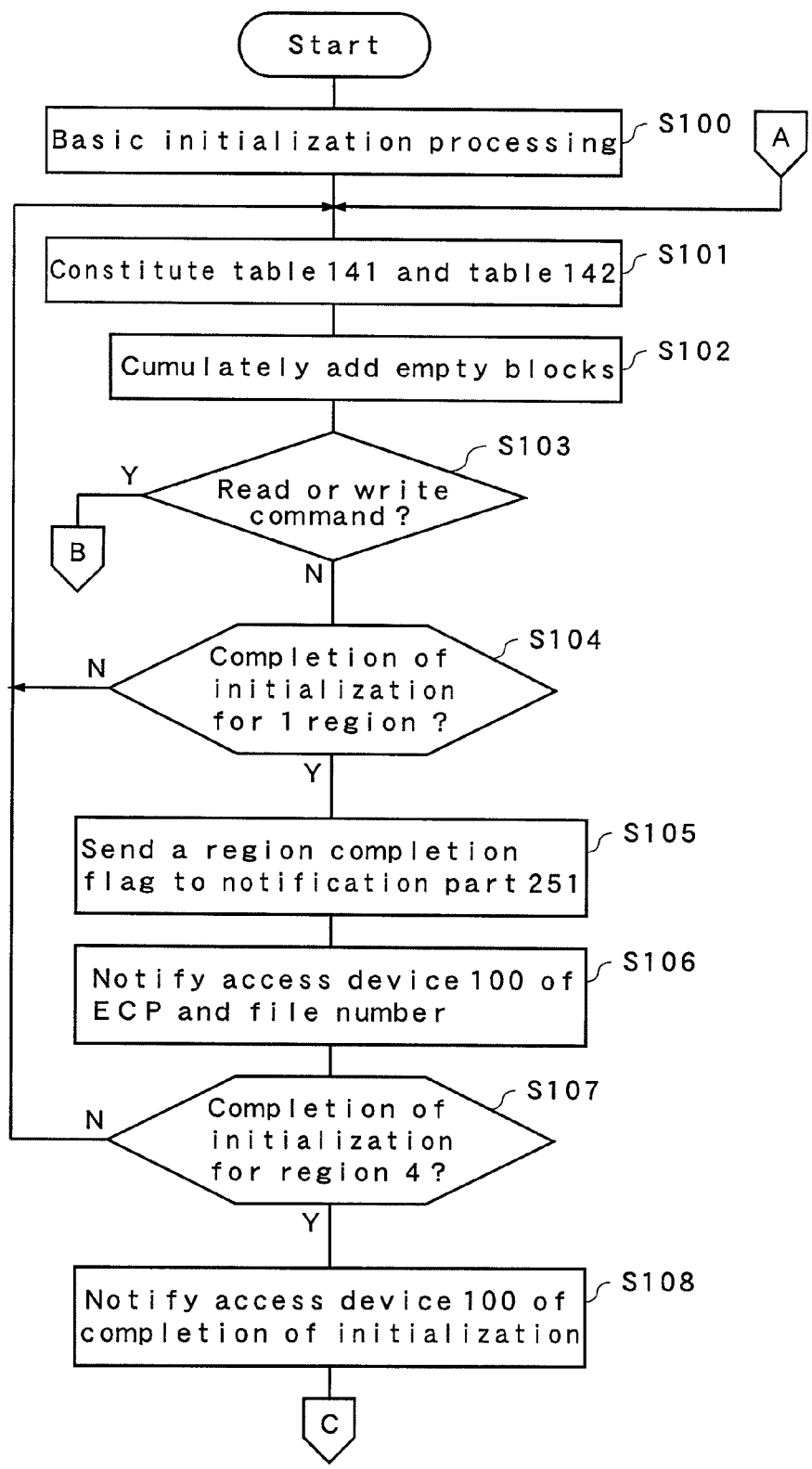
FIG. 9A is a flowchart showing detection of an empty capacity and notification processing of an empty capacity parameter.
Figure 9B:
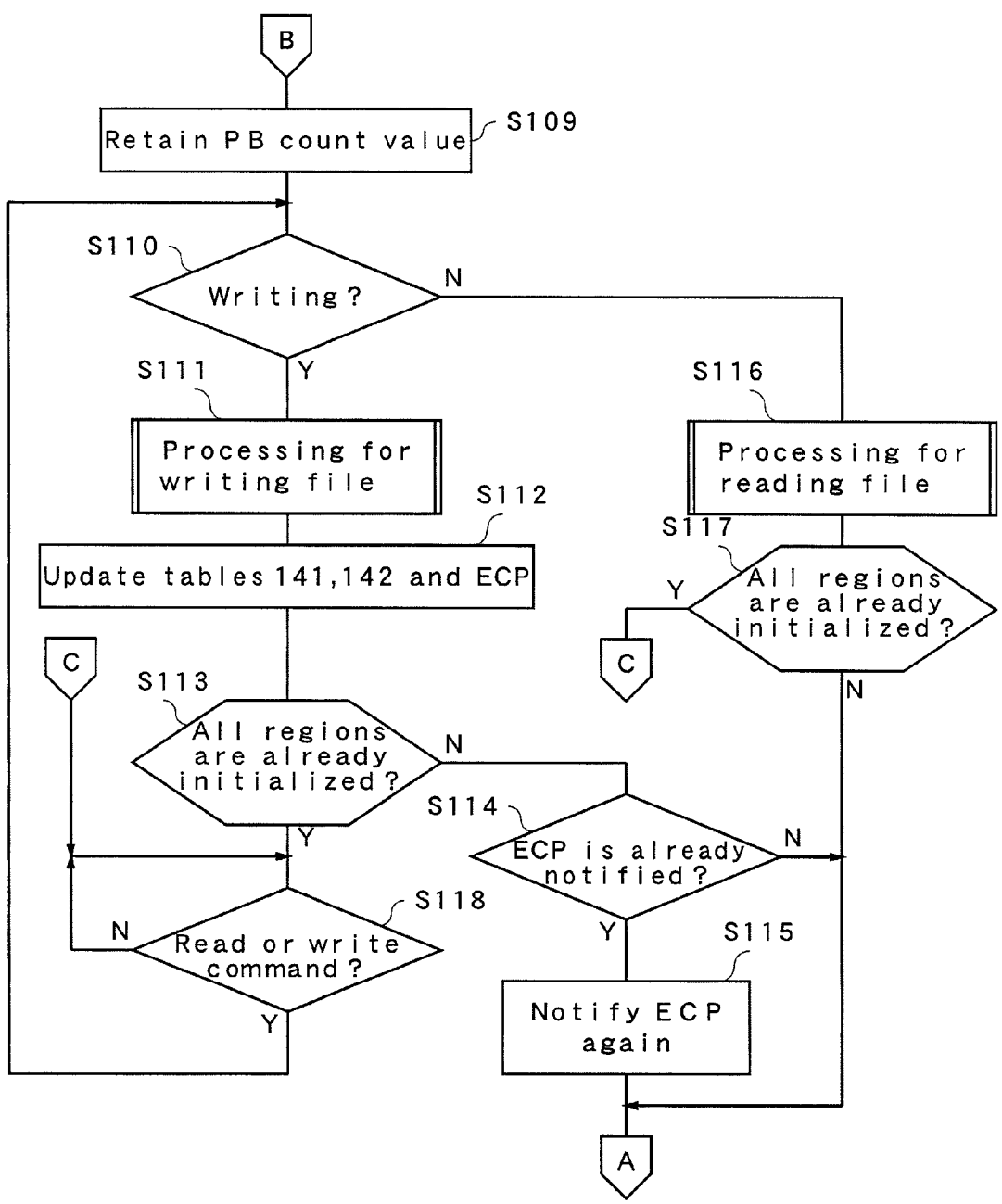
FIG. 9B is a flowchart showing the detection of the empty capacity and the notification processing of the empty capacity parameter.

The initialization processing of the nonvolatile memory device 200 at start-up of the power source is firstly explained. FIG. 9A and FIG. 9B are flowcharts showing detection of an empty capacity and notification processing of the empty capacity parameter, and FIG. 10 is an explanation view showing a notification sequence of the empty capacity parameter in the partial notification mode. When the nonvolatile memory device 200 is attached to the access device 100, the access device 100 supplies the power to the nonvolatile memory device 200 via an external bus. A time of this start-up of the power source is t0. The memory controller 220 subsequently executes basic initialization processing, for example, clearing internally provided various RAMs and releasing a reset to the nonvolatile memory 210 (S100). A period from time t0 to time t1 in FIG. 3 shows this basic initialization processing.

The memory controller shifts to a period of creating various tables after the time t1 at which the basic initialization processing completes. The read and write controller 240 constitutes the physical region management table 241 and the mapping table 242 one physical block by one physical block on a RAM provided in the read and write controller 240 by reading a first page of each physical block in ascending order from a physical block number PB1 in the nonvolatile memory 210, extracting the block statuses and file numbers written in the management portion, and copying them to the RAM provided in the read and write controller 240 (S101).

Figure 11:
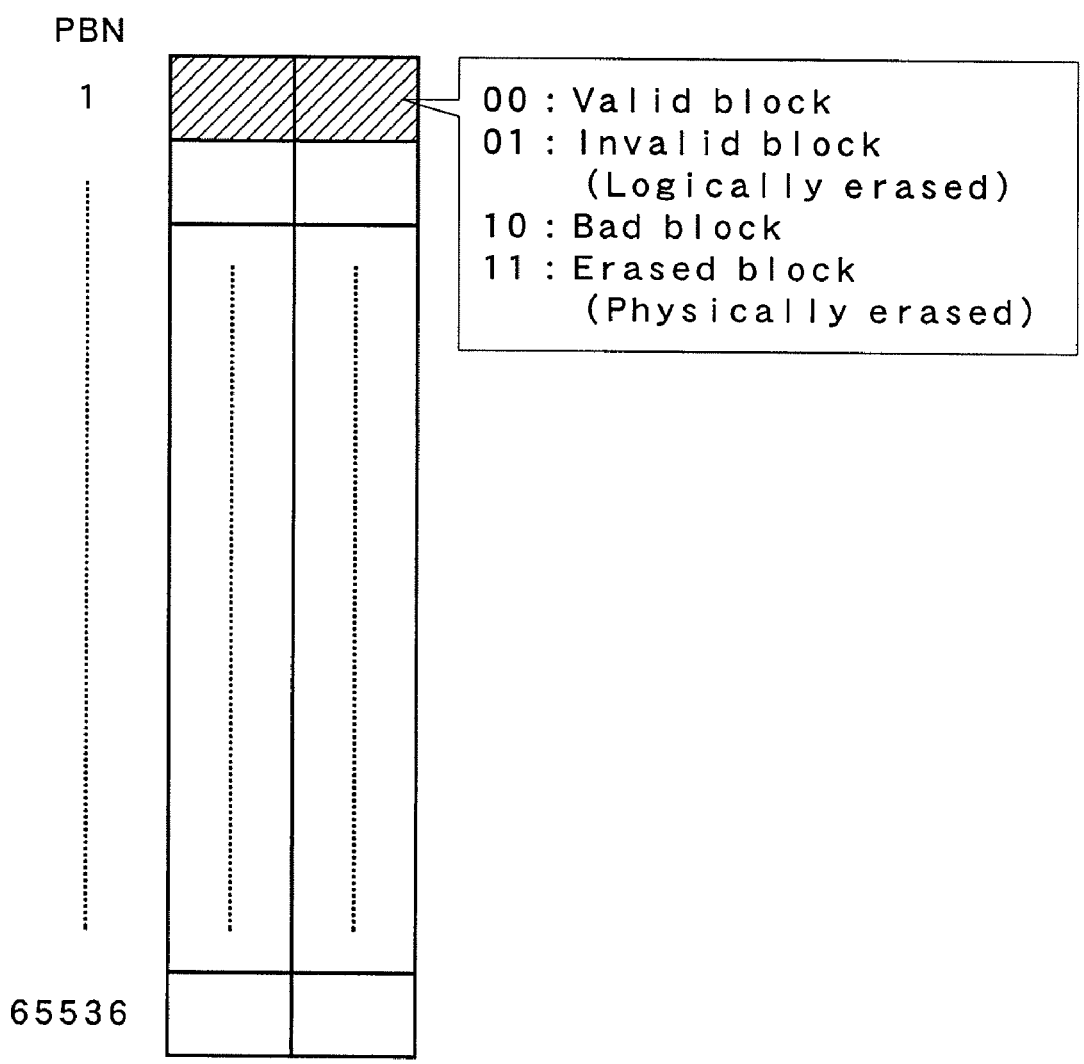
FIG. 11 is a memory map showing a physical region management table.

FIG. 11 is a memory map showing a physical region management table 241 retaining the block statuses. The block status is information of 2 bits; the value 00 shows a state where valid data is stored in a corresponding physical block and the value 01 shows a state where data stored in a corresponding physical block is logically erased on the physical region management table 241. The value 10 shows a state where a corresponding physical block is a bad block and the value 11 shows a state where a corresponding physical block is physically erased. The physical blocks shown by the value 01 and value 11 are defined as an empty block. When the access device 100 issues a write command, the read and write controller 240 selects the empty block as a block to be written. Meanwhile, the physical block of value 01 is used for data writing after physically erased. The file number is a file number designated by the access device 100 when file data is written in processing at the normal operation described later.

FIG. 12 is a memory map showing the mapping table 242. The mapping table 242 stores physical block numbers storing file data corresponding to the file numbers FN on the basis of the file number designated by the access device 100. In a case of a file composed of a plurality of physical blocks, the table stores the first one of the physical blocks.

The empty capacity detector 260 cumulatively adds the number of physical blocks, namely, the empty physical blocks, whose block statuses in the physical region management table 241 shown in FIG. 11 store the value 01 or value 11 in each table constitution processing for one physical block, and the empty capacity parameter retainer 252 sequentially stores the cumulatively additional value as an empty capacity parameter ECP. Here, if i shows region numbers (1 to 4), firstly the detector cumulatively adds empty capacity parameter ECP1 of the region 1.

The read and write controller 240 confirms in each table constitution of one physical block whether or not the access device 100 issues a read or write command (S103). When the read or write command is not issued, the read and write controller 240 judges at S104 whether or not the table constitution processing for one region has completed. When the table constitution processing has not completed, the controller increments the physical block number in ascending order and continues the table constitution returning to step S101.

When the processing for one region has completed at step S104, the controller sends a region completion flag to the notification part 251 (S105). This sets the notification part to a notification ready state, and the notification part 251 notifies the access device 100 of the empty capacity parameter ESP i (S106). FIG. 10(B) shows ECPi outputted to an external bus, and FIG. 10(C) shows a value of ECPi at the moment. After that, ESP i of region i is reset. At this moment, the notification part 261 simultaneously notifies a file number recorded in an initialized region.

The read and write controller 240 judges whether or not processing for region 4 has completed (S107), and, if the processing has not completed, the processing returns to S101. In FIG. 10(C), when regions 1 to 4 includes, for example, 1,000 empty physical blocks, 1,015 empty physical blocks, 936 empty physical blocks, and 1,127 empty physical blocks, respectively, the nonvolatile memory device 200 notifies the access device 100 of the numbers of the empty physical blocks as empty capacity parameters ECP1, ECP2, ECP3, and ECP4 and, in addition, notifies the access device of the completion of initialization processing immediately after the notification of empty capacity parameter ECP4 of region 4. As shown in FIG. 10, time required for creating the various table dominates the period of initialization.

In FIG. 10, since the initialization of region 4 has completed at time t5, the read and write controller 240 notifies the access device 100 of the completion of initialization (S108), and the processing proceeds to S118.

When a read or write command is issued at S103, the processing shifts to a processing in the normal operation. The read and write controller 240 retains a count value of physical block number already included in the table constitution so as to specify a target physical block from which the initialization processing restarts after the normal processing completed (S109). And the read and write controller judges whether the command is a write command or not at S110. In the case of the write command, the controller writes a file at S111, and updates the physical region management table 141 and the mapping table 142 in accordance with the written file. In addition, the controller also updates the empty capacity parameter ECP of the region to which the file is written (S112). Then, proceeding to S113, the controller judges whether or not the initialization for all of the regions has already completed. If the initialization has not completed, the controller judges whether the empty capacity parameter ECP has already been notified or not proceeding to S114. If the parameter has already been notified, since the value of the empty capacity parameter changes at S112, the controller notifies the access device again of the empty capacity parameter calculated on the basis of the updated physical region management table (S115). In addition, if the command is not for the write processing at S110, the command is for reading data, and the controller reads a file proceeding to S116 and judges at S117 whether or not the initialization for all of the regions has completed. If the initialization has not completed, the controller continues the initialization processing returning to S101. In this case, returning to S101 in FIG. 9A, the controller continues the table constitution from the number next to the PB count value recorded at S109. When the initialization for all of the regions has completed at S117, the processing proceeds to S118. In addition, when the regions has been initialized at S113, the controller further waits for a read or write command proceeding to S118. When the access device issues a read or write command, the controller repeats the same processing returning to S110.

Figure 13:
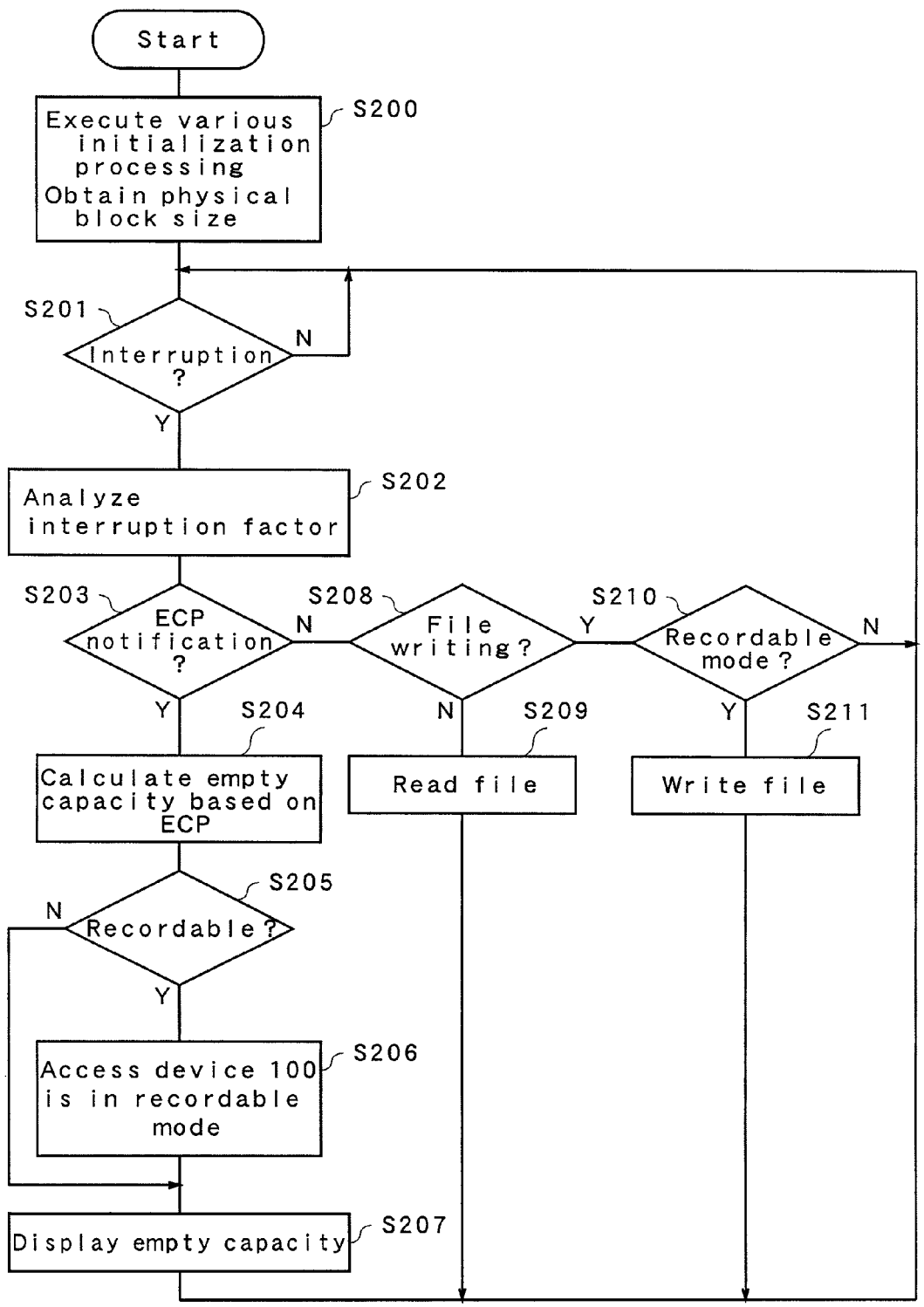
FIG. 13 is a flowchart showing processing of the access device.

Next, initialization processing of the access device 100 will be explained. FIG. 13 is a flow chart showing processing of the access device 100. At S200 in FIG. 13, the access device 100 executes various initialization processings, and obtains a physical block size from the nonvolatile memory device 200. In this manner, the access device makes preparations for calculation of the empty capacity based on the empty capacity parameter. Explanations of other processings will be omitted to simplify the description.

[Processing at a Normal Operation]

After the above described initialization processing, the nonvolatile memory system shifts to the normal operation. Referring to FIG. 13, processing of the access device 100 will be explained. The application 120 waits until the user interface 130 or the interface 110 requests an interruption (S201), and analyzes a cause of the interruption after the interruption is requested (S202). Here, the interruption factor is a notification of empty capacity parameter or an operation for recording and reproducing user's file data.

When the interruption factor is the notification of empty capacity parameter from the nonvolatile memory device 200

(S203), the empty capacity parameter receiver 111 of the interface 110 receives the empty capacity parameter ECPi. In the partial notification mode, the access device 100 side includes a function for summing up the respective empty capacity parameters of regions 1 to 4, and, at S204 in FIG. 13, the application 120 calculates the empty capacity by performing expression (1);

$$\text{Empty capacity} = \Sigma ECPi \times \text{Physical block size}(16 \text{ Kbytes}) \quad (1).$$

Next, the application 120 judges whether or not the empty capacity is sufficient for recording the file data (S205). If the recording is possible, the access device 100 turns into a recordable mode, and the user interface 130 validates the recording operation (S206) and displays the empty capacity on the display part 131 (S207). At this moment, it is possible to improve a response of not only recording but reading by simultaneously displaying, for example, the file numbers of the initialized region according to user's instruction.

Returning to the explanation of S203, when the interruption factor is not the notification of empty capacity parameter but the operation for recording and reproducing user's file data (S203), the application 120 analyzes the operation to the user interface 130, and judges whether the operation is the file writing or not (S208). When the operation is not the file writing, the application reads a file at S209 (S209). Meanwhile, When the operation is the file writing, the application judges whether or not the access device is in the recordable mode (S210). When the access device is not in the recordable mode, the processing returns to S201, and, when the access device is in the recordable mode, the processing proceeds to S211 and the application executes a file writing control.

FIG. 14 is a time chart showing an outline of a communication procedure between the access device 100 and the nonvolatile memory device 200. (A) shows a communication procedure in the writing of file data, and (B) shows a communication procedure in the reading of file data. As for a sequence of the processing of the above mentioned file reading and writing, in a case of the file writing, the application 120 issues a write command to the nonvolatile memory device 200 via the interface 110 as shown in FIG. 14, and subsequently transfers a file number, file size, and file data to the nonvolatile memory device 200. Suffixes 1 to j are added to file data for each physical block size.

Next, processing on the nonvolatile memory device 200 side will be explained. At first, when receiving a write command, file number, file size, and file data (file data 1 to file data j), the interface 230 orders write processing to the read and write controller 240. Here, the file number is 1, and the suffix j is equal to 4, namely, a size of the file data is equivalent to a size of 4 physical blocks.

Figure 15A:
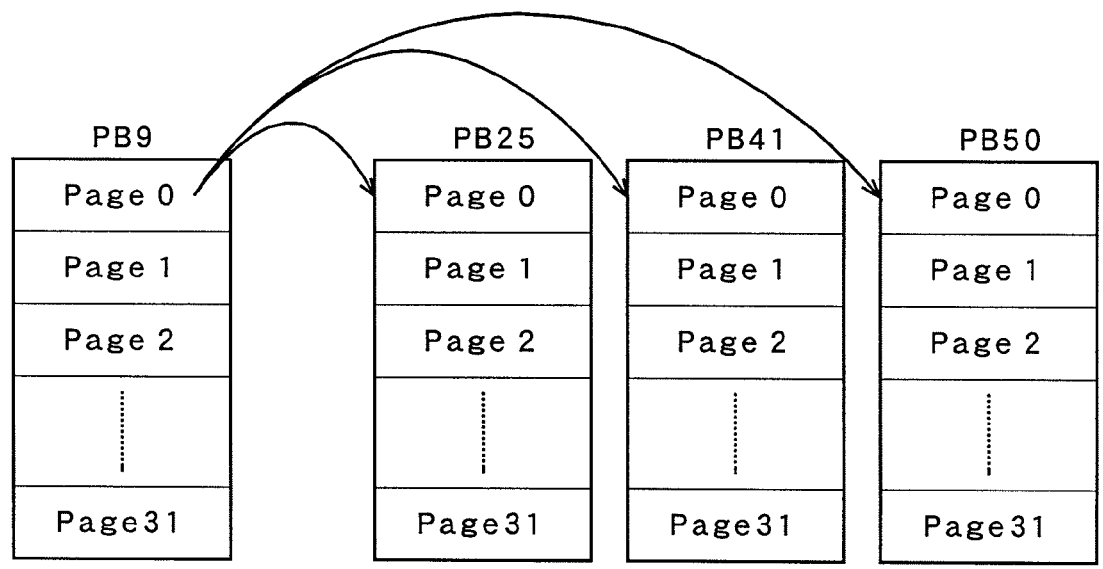
FIG. 15A is an explanation view showing a link state of physical blocks storing a file data.
Figure 15B:
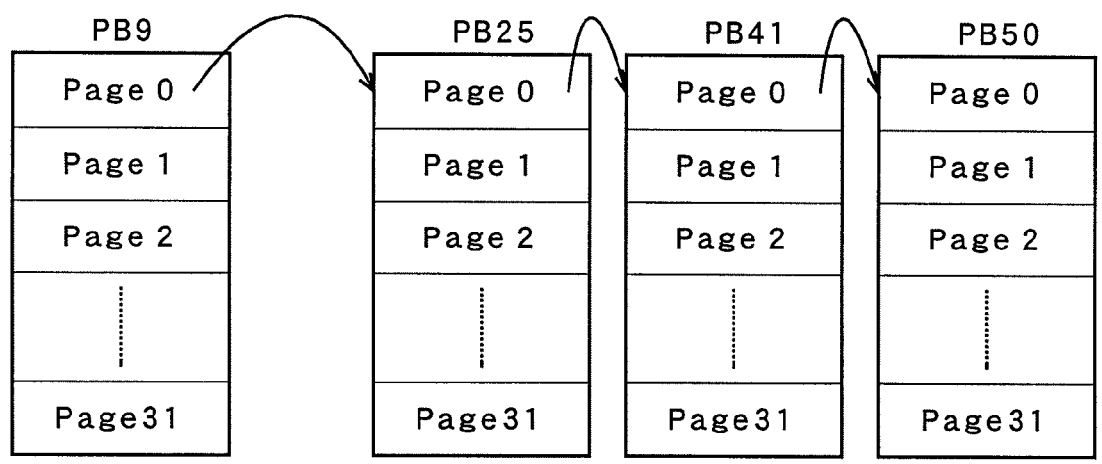
FIG. 15B is an explanation view showing a link state of physical blocks storing a file data.

Referring to the physical region management table 241, the read and write controller 120 obtains 4 erased block numbers of file data 1 to file data 4, for example, PB9, PB25, PB41, and PB50, and stores the physical block number (PB9) corresponding to file data 1 among the obtained 4 blocks at a position of file number 1 in the mapping table 242. After that, the controller writes file data 1 to pages 0 to 31 of PB9 in series as shown in FIG. 15A, and writes file data 2 to 4 to PB25, PB41, and PB50 in the same manner, respectively. The controller stores the physical block numbers indicating PB25, PB41, and PB50 to a management region in page 0 of PB9 as a pointer. In addition, the pointer may be stored one after another as shown in FIG. 15B.

Next, processing for reading file data will be explained. In a case of the file reading, the application 120 issues a read command to the nonvolatile memory device 200 via the interface 110 as shown in FIG. 14(B), and subsequently transfers a file number, offset, and read size to the nonvolatile memory device 200. The offset is for specifying a head portion to be read in the file data. After receiving the read command, file number, offset, and read size, the interface 230 of the nonvolatile memory device sends the read command to the read and write controller 240. Here, the file number is 1, the offset is 16 kbytes, and the read size is 32 kbytes, namely, a size equal to 2 physical blocks. In addition, a unit of the offset and read size is 16 kbytes in the present embodiment, however, the unit is not limited to this size.

The read and write controller 240 obtains the physical block number (PB9) stored in the position of file number 1 in the mapping table, and reads the pointer stored in the management region of PB9. For example, in the case of FIG. 15A, the physical block numbers, PB25, PB41, and PB50, are collectively recorded to the management region of PB9 in a regular manner so that a constitutional order of file data, namely, the order of file data 1 to 4, can be identified, and the controller determines a physical block to be read on the basis of the offset value. Here, since the offset value is 16 kbytes and the read size is 32 kbytes, 2 blocks from PB25 next to PB9, namely, PB25 and PB41 are target physical blocks to be read. The read and write controller 240 reads PB25 and PB41 from the nonvolatile memory 210, and transfers them to the access device 100 via the interface 230 as file data.

Figure 16:
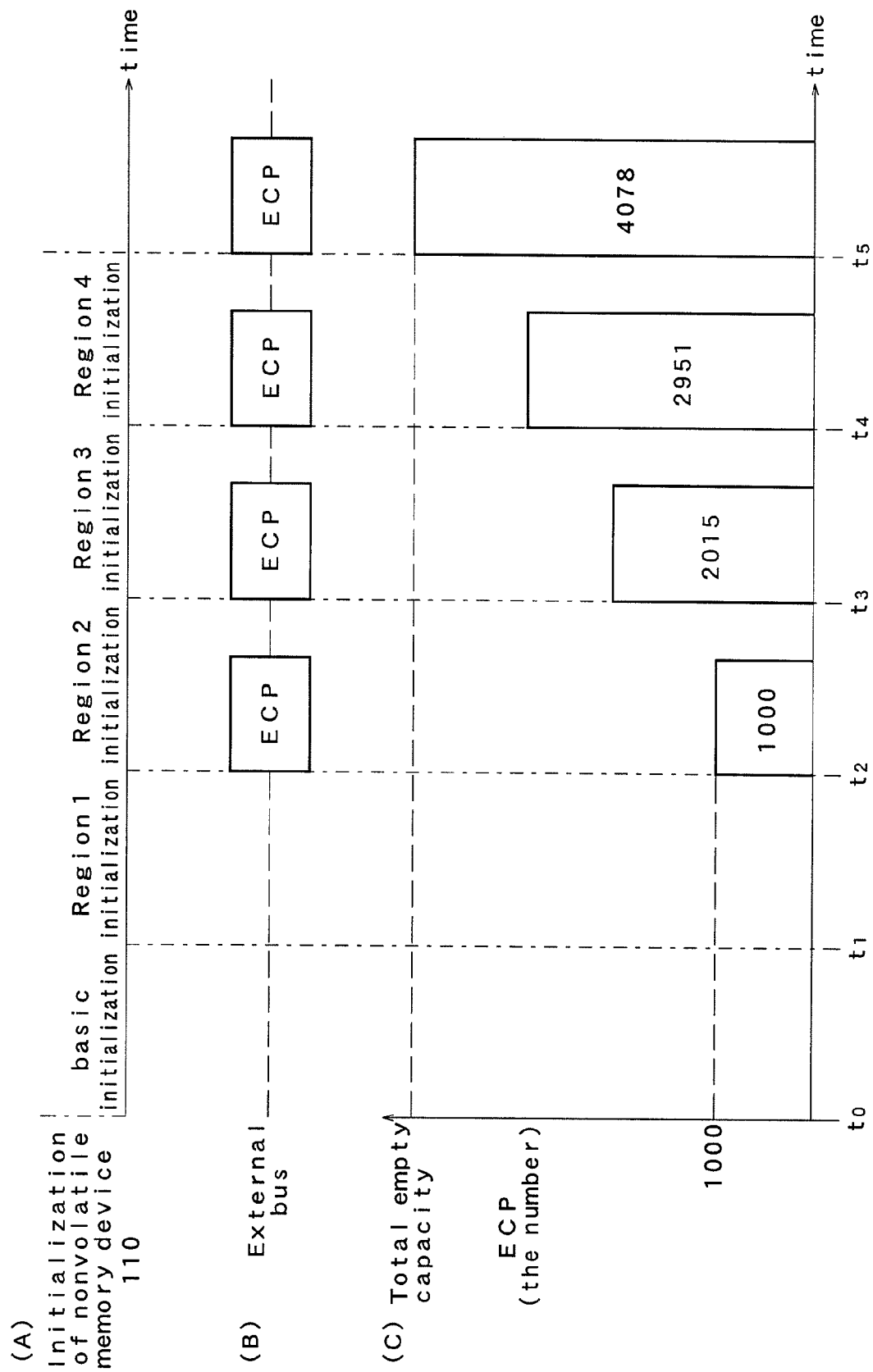
FIG. 16 is an explanation view showing a notification sequence of the empty capacity parameter in a cumulative notification mode.

Referring to FIG. 16, a notification of empty capacity parameter in the cumulative notification mode will be explained. FIG. 16 is an explanation view showing a notification sequence of empty capacity parameter in the cumulative notification mode. As shown in FIG. 16(A), in the cumulative notification mode, the nonvolatile memory device also turns into a period of the basic initialization processing immediately after the start-up of power source, and constitutes the physical region management table 241 and the mapping table 242 by checking the management portions in first pages of the physical blocks of regions 1 to 4 of the nonvolatile memory 210 in a period of creating various tables. Upon completion of the constitution of the physical region management table 241 and the mapping table 242 corresponding to respective regions 1 to 4, the nonvolatile memory device notifies the access device 100 of empty capacity parameters of the regions on each completion of constitution of the tables.

In the case of cumulative notification mode, it is not required to reset the empty capacity parameter ECP for each region at step S106. Accordingly, the empty capacity parameter sequentially increasing in each completion of the initialization for the respective regions is sent as shown in FIG. 16 (C). Then, the nonvolatile memory device 200 notifies a cumulative value of empty capacity parameters ECP of regions 1 to 4 after completion of the initialization for all of the regions.

The empty capacity parameters ECP notified after the initialization for each of region 1 to 4 are parameters of all empty capacities writable at that moment in the nonvolatile memory 210. That is, in the case of cumulative notification mode, the empty capacity is calculated based on expression (2);

$$\text{Empty capacity} = ECP \times \text{Physical block size}(16 \text{ kbytes}) \quad (2).$$

Also in the cumulative notification mode, the nonvolatile memory device 200 notifies the access device 100 of empty capacity parameter corresponding to an initialized region, and, when the access device 100 determines that the empty capacity parameter satisfies a recordable capacity (S205 in FIG. 13), the access device turns into the recordable mode and can write file data at that moment.

As described above, the nonvolatile memory system shown in the embodiment of the present invention is based on an access method where the access device 100 side designates a file to be read or written to the nonvolatile memory device 200. In this nonvolatile memory system, the empty capacity detector 260 detects an empty capacity by dividing the nonvolatile memory 210 into regions 1 to 4 in the initialization processing after the start-up of the power, and the empty capacity parameter notification part 250 notifies the access device of the empty capacity parameter related to the empty capacity in a stepwise fashion during the period of initialization processing. For this reason, when the empty capacity has exceeded a size required to write file, the file data can be written. That is, the file data can be written to the nonvolatile memory 210 without waiting the completion of the entire initialization, and a response in the writing can be improved as the result. In addition, the memory system can read a part of file without waiting the completion of initialization by notifying, an outside of a file ID recorded in the completed region when the initialization partially completes.

In the present embodiment, a case with no bad block was explained to simplify the description, however, a case with the bad block can also realize the effects of the present invention by providing an alternative region other than regions 1 to 4. In addition, in the embodiment explained here, the empty capacity parameter receiver 111 receives the empty capacity parameter notified by the nonvolatile memory device 200. In place of this, as shown in FIG. 17, the interface 110 on the access device 100 side may include the empty capacity parameter obtaining part 112, and may actively obtain the empty capacity parameter from the nonvolatile memory 210. The empty capacity parameter obtaining part 112 may directly read the parameter from the empty capacity parameter retainer 252, and may temporarily store a value retained by the empty capacity parameter retainer 252 in the interface 230 and obtain the value. In this case, the notification part 251 notifies the empty capacity parameter in response to a requirement from the empty capacity parameter obtaining part 112.

Moreover, in the present embodiment, the empty capacity parameter is the number of empty physical blocks, however, any usable parameters for calculating an empty capacity can be employed. In addition, the access device 100 side may set a size used by the device for judging whether file data can be recorded or not. For example, in a digital still camera, a possibility of allowing the recording at a notification time of the first capacity parameter, namely, a notification time of capacity parameter of region 1 will be higher in a case of choosing a file size corresponding to an image mode of the smallest file size. In addition, in the embodiment, the nonvolatile memory was divided fixedly into 4 regions, 1 to 4, however, this division number may be freely determined and, for example, the access device 100 side may determine the number and indicate the determined number to the nonvolatile memory system 200 side. Furthermore, the nonvolatile memory system of the embodiment uses the nonvolatile memory device 200 by attaching the device to the access device 100, however, the memory system may incorporate the nonvolatile memory device 200 in the access device 100.

INDUSTRIAL APPLICABILITY

The present invention proposes a method for improving a response of the nonvolatile memory system in the recording, and is beneficial for a still image recording and reproducing device, mobile phone, and the like using a nonvolatile memory device such as a semiconductor memory card.

The invention claimed is:

1. A memory controller which is connected to a nonvolatile memory, comprising:
    a read and write controller that writes file data received from an access device to the nonvolatile memory, and reads file data from the nonvolatile memory;
    an empty capacity detector that detects an empty capacity of an initialized region during an initialization of the nonvolatile memory; and
    a notifier that notifies the access device of the empty capacity detected by the empty capacity detector,
    wherein, when the memory controller receives a request for writing file data from the access device during the initialization of the nonvolatile memory, the read and write controller suspends the initialization of the nonvolatile memory and writes the file data into the initialized region in the nonvolatile memory.

2. The memory controller according to claim 1, wherein the empty capacity detector detects, for each divided region of the nonvolatile memory, the empty capacity of the region.

3. The memory controller according to claim 1, wherein the empty capacity detector detects the empty capacity of all of already initialized regions during the initialization of the nonvolatile memory.

4. The memory controller according to claim 1, wherein the notifier notifies the access device of a file ID stored in the initialized region in addition to the empty capacity.

5. A nonvolatile memory device comprising:
    a nonvolatile memory; and
    a memory controller connected to the nonvolatile memory, wherein the memory controller comprises:
    a read and write controller that writes file data received from an access device to the nonvolatile memory, and reads file data from the nonvolatile memory;
    an empty capacity detector that detects an empty capacity of an initialized region during an initialization of the nonvolatile memory; and
    a notifier that notifies the access device of the empty capacity detected by the empty capacity detector,
    wherein, when the memory controller receives a request for writing file data from the access device during the initialization of the nonvolatile memory, the read and write controller suspends the initialization of the nonvolatile memory and writes the file data into the initialized region in the nonvolatile memory.

6. The nonvolatile memory device according to claim 5 wherein
    the empty capacity detector detects, for each divided region of the nonvolatile memory, the empty capacity of the region.

7. The nonvolatile memory device according to claim 5 wherein
    the empty capacity detector detects the empty capacity of all of already initialized regions during the initialization of the nonvolatile memory.

8. The nonvolatile memory device according to claim 5 wherein
    the notifier notifies the access device of a file ID stored in the initialized region in addition to the empty capacity.

9. An access device which is connected to a nonvolatile memory device having a nonvolatile memory and uses the nonvolatile memory device, wherein
    the access device comprises:
    an empty capacity receiver that receives a notification of the empty capacity from the nonvolatile memory device during an initialization of the nonvolatile memory; and an application that judges whether or not writing of file data to the nonvolatile memory device is possible on the basis of the notification of the empty capacity received by the empty capacity receiver and writes the file data to the nonvolatile memory device, when it is judged that writing of the file data to the nonvolatile memory device is possible during the initialization of the nonvolatile memory.

10. The access device according to claim 9, wherein the access device further comprises a display that displays information related to the empty capacity of the nonvolatile memory device on the basis of the notification of the empty capacity received from the nonvolatile memory device by the empty capacity receiver.

11. An access device which is connected to a nonvolatile memory device having a nonvolatile memory and uses the nonvolatile memory device, wherein
the access device includes:
an empty capacity acquirer that obtains a notification of the empty capacity from the nonvolatile memory device during an initialization of the nonvolatile memory; and
an application that judges whether or not writing of file data to the nonvolatile memory device is possible on the basis of the notification of the empty capacity obtained by the empty capacity acquirer and writes the file data to the nonvolatile memory device, when it is judged that writing of the file data to the nonvolatile memory device is possible during the initialization of the nonvolatile memory.

12. The access device according to claim 11, wherein the access device further comprises a display that displays information related to the empty capacity of the nonvolatile memory device on the basis of the notification of the empty capacity obtained from the nonvolatile memory device by the empty capacity acquirer.

13. A nonvolatile memory system comprising:
an access device; and
a nonvolatile memory device comprising:
a nonvolatile memory; and
a memory controller connected to the nonvolatile memory, wherein the memory controller includes:
a read and write controller that writes file data received from the access device to the nonvolatile memory, and reads file data from the nonvolatile memory;
an empty capacity detector that detects an empty capacity of an initialized region during an initialization of the nonvolatile memory; and
a notifier that notifies the access device of the empty capacity detected by the empty capacity detector,
wherein, when the memory controller receives a request for writing file data from the access device during the initialization of the nonvolatile memory, the read and write controller suspends the initialization of the nonvolatile memory and writes the file data into the initialized region in the nonvolatile memory, and
wherein the access device includes:
an empty capacity receiver that receives a notification of the empty capacity from the nonvolatile memory device during the initialization of the nonvolatile memory; and
an application that judges whether or not writing of file data to the nonvolatile memory device is possible on the basis of the notification of the empty capacity received by the empty capacity receiver and writes the file data to the nonvolatile memory device, when it is judged that writing of the file data to the nonvolatile memory device is possible during the initialization of the nonvolatile memory.

14. The nonvolatile memory system according to claim 13, wherein
the empty capacity detector detects, for each divided region of the nonvolatile memory, the empty capacity of the region.

15. The nonvolatile memory system according to claim 13, wherein
the empty capacity detector detects the empty capacity of all of already initialized regions during the initialization of the nonvolatile memory.

16. The nonvolatile memory system according to claim 13, wherein
the notifier notifies the access device of a file ID stored in the initialized region in addition to the empty capacity.

17. A nonvolatile memory system comprising:
an access device; and
a nonvolatile memory device comprising:
a nonvolatile memory; and
a memory controller connected to the nonvolatile memory, wherein the memory controller includes:
a read and write controller that writes file data received from the access device to the nonvolatile memory, and reads file data from the nonvolatile memory;
an empty capacity detector that detects an empty capacity of an initialized region during an initialization of the nonvolatile memory; and
a notifier that notifies the access device of the empty capacity detected by the empty capacity detector
wherein, when the memory controller receives a request for writing file data from the access device during the initialization of the nonvolatile memory, the read and write controller suspends the initialization of the nonvolatile memory and writes the file data into the initialized region in the nonvolatile memory, and
wherein the access device includes:
an empty capacity acquirer that obtains a notification of the empty capacity from the nonvolatile memory device during the initialization of the nonvolatile memory; and
an application that judges whether or not writing of file data to the nonvolatile memory device is possible on the basis of the notification of the empty capacity obtained by the empty capacity acquirer and writes the file data to the nonvolatile memory device, when it is judged that writing of the file data to the nonvolatile memory device is possible during the initialization of the nonvolatile memory.

18. The nonvolatile memory system according to claim 17, wherein
the empty capacity detector detects, for each divided region of the nonvolatile memory, the empty capacity of the region.

19. The nonvolatile memory system according to claim 17, wherein
the empty capacity detector detects the empty capacity of all of already initialized regions during the initialization of the nonvolatile memory.

20. The nonvolatile memory system according to claim 17, wherein
the notifier notifies the access device of a file ID stored in the initialized region in addition to the empty capacity.

* * * * *